United States Patent
Kim et al.

(10) Patent No.: US 9,252,130 B2
(45) Date of Patent: Feb. 2, 2016

(54) METHODS OF MANUFACTURING FLIP CHIP SEMICONDUCTOR PACKAGES USING DOUBLE-SIDED THERMAL COMPRESSION BONDING

(71) Applicant: STATS ChipPAC, Ltd., Singapore (SG)

(72) Inventors: KyungMoon Kim, Gyeonggi-do (KR); YoungChul Kim, Kyoungki-do (KR); HunTeak Lee, Gyeonggi-do (KR); KeonTaek Kang, Kyoungki-do (KR); HeeJo Chi, Kyoungki-do (KR)

(73) Assignee: STATS ChipPAC, Ltd., Singapore (SG)

( * ) Notice: Subject to any disclaimer, the term of this patent is extended or adjusted under 35 U.S.C. 154(b) by 111 days.

(21) Appl. No.: 13/853,810

(22) Filed: Mar. 29, 2013

(65) Prior Publication Data

US 2014/0295618 A1  Oct. 2, 2014

(51) Int. Cl.
*H01L 25/065* (2006.01)
*H01L 23/31* (2006.01)
*H01L 23/00* (2006.01)

(52) U.S. Cl.
CPC ............ *H01L 25/0657* (2013.01); *H01L 24/97* (2013.01); *H01L 23/3128* (2013.01); *H01L 24/05* (2013.01); *H01L 24/13* (2013.01); *H01L 24/16* (2013.01); *H01L 24/17* (2013.01); *H01L 24/29* (2013.01); *H01L 24/32* (2013.01); *H01L 24/48* (2013.01); *H01L 24/73* (2013.01); *H01L 24/75* (2013.01); *H01L 24/81* (2013.01); *H01L 24/83* (2013.01); *H01L 2224/0345* (2013.01); *H01L 2224/0346* (2013.01); *H01L 2224/03452* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/13023* (2013.01); *H01L 2224/16145* (2013.01); *H01L 2224/16225* (2013.01); *H01L 2224/16227* (2013.01); *H01L 2224/1703* (2013.01); *H01L 2224/17181* (2013.01); *H01L 2224/32225* (2013.01); *H01L 2224/48145* (2013.01); *H01L 2224/73104* (2013.01); *H01L 2224/73204* (2013.01); *H01L 2224/73207* (2013.01); *H01L 2224/75251* (2013.01); *H01L 2224/75252* (2013.01); *H01L 2224/75704* (2013.01); *H01L 2224/75705* (2013.01); *H01L 2224/81191* (2013.01); *H01L 2224/81203* (2013.01); *H01L 2224/83191* (2013.01); *H01L 2224/83192* (2013.01); *H01L 2224/94* (2013.01); *H01L 2224/97* (2013.01); *H01L 2225/06506* (2013.01); *H01L 2225/06513* (2013.01); *H01L2225/06517* (2013.01); *H01L 2225/06541* (2013.01); *H01L 2225/06568* (2013.01); *H01L 2924/01322* (2013.01); *H01L 2924/15311* (2013.01); *H01L 2924/181* (2013.01); *H01L 2924/18161* (2013.01)

(58) Field of Classification Search
None
See application file for complete search history.

(56) References Cited

U.S. PATENT DOCUMENTS

6,000,127 A   12/1999   Eifuku et al.
6,966,964 B2 *  11/2005   Nakamura et al. .........  156/275.5
(Continued)

*Primary Examiner* — Andres Munoz
(74) *Attorney, Agent, or Firm* — Robert D. Atkins; Patent Law Group: Atkins and Associates, P.C.

(57) ABSTRACT

Methods of producing a semiconductor package using dual-sided thermal compression bonding includes providing a substrate having an upper surface and a lower surface. A first device having a first surface and a second surface can be provided along with a second device having a third surface and a fourth surface. The first surface of the first device can be coupled to the upper surface of the substrate while the third surface of the second device can be coupled to the lower surface of the substrate, the coupling occurring simultaneously to produce the semiconductor package.

27 Claims, 8 Drawing Sheets

(56) References Cited

U.S. PATENT DOCUMENTS

| | | |
|---|---|---|
| 7,087,458 B2 | 8/2006 | Wang et al. |
| 7,459,797 B2 * | 12/2008 | James et al. ............... 257/787 |
| 7,793,413 B2 * | 9/2010 | Sakai et al. ............... 29/840 |
| 2002/0079594 A1 * | 6/2002 | Sakurai ............... 257/778 |
| 2008/0104831 A1 * | 5/2008 | Haji et al. ............... 29/833 |
| 2012/0175769 A1 | 7/2012 | Pendse |
| 2012/0228760 A1 | 9/2012 | Lim et al. |
| 2012/0230001 A1 | 9/2012 | Takahashi et al. |

* cited by examiner

METHODS OF MANUFACTURING FLIP CHIP SEMICONDUCTOR PACKAGES USING DOUBLE-SIDED THERMAL COMPRESSION BONDING

TECHNICAL FIELD

The present disclosure relates generally to semiconductor packaging, and particularly, to the manufacturing of flip chip semiconductor packages using double-sided thermal compression bonding.

BACKGROUND

Flip chip packages include a semiconductor die mounted onto a package substrate with the active side of the die facing the substrate. Flip chip technology is gaining increasing interest in semiconductor packaging by virtue of compelling advantages in miniaturization and electrical performance over conventional wire bonding technology. However, challenges remain in the areas of infrastructure, manufacturing cost and design.

SUMMARY

Methods of manufacturing flip chip semiconductor packages using double-sided thermal compression bonding are disclosed. In one embodiment, a method of manufacturing a semiconductor package includes: (a) providing a substrate having an upper surface and a lower surface, (b) providing a first device having a first surface and a second surface, (c) providing a second device having a third surface and a fourth surface, and (d) coupling, simultaneously, the first device and the second device to the substrate such that the first surface of the first device faces the upper surface of the substrate and the third surface of the second device faces the lower surface of the substrate.

In one embodiment, the providing step (b) includes the first surface of the first device having a first set of bumps formed thereon and the providing step (c) includes the third surface of the second device having a second set of bumps formed thereon, such that the first set of bumps makes physical contact with the upper surface of the substrate and the second set of bumps makes physical contact with the lower surface of the substrate during the coupling step (d).

In one embodiment, the providing step (b) includes forming a first non-conductive material adjacent the first set of bumps such that the first non-conductive material makes physical contact with the upper surface of the substrate during the coupling step (d).

In one embodiment, the providing step (c) includes forming a second non-conductive material adjacent the second set of bumps such that the second non-conductive material makes physical contact with the lower surface of the substrate during the coupling step (d).

In some embodiments, before the coupling step (d), a first non-conductive material can be applied to the upper surface of the substrate such that the first non-conductive material makes physical contact with the first set of bumps and the first surface of the first device during the coupling step (d). In the alternative, a second non-conductive material can be applied to the lower surface of the substrate such that the second non-conductive material makes physical contact with the second set of bumps and the third surface of the second device during the coupling step (d).

In one embodiment, the method of manufacturing the semiconductor package includes: (e) applying heat and force, simultaneously, to the second surface of the first device and the fourth surface of the second device to secure the first device and the second device to the substrate. In another embodiment, the method further includes: (e) forming a plurality of external interconnects on the lower surface of the substrate for routing electrical signals from at least one of the first device and the second device. In another embodiment, the method further includes: (f) forming an encapsulant that substantially covers the first device and the upper surface of the substrate. In yet another embodiment, the method further includes: (e) mounting a third device over the second surface of the first device, the third device in communication with at least one of the first device and the second device.

In one embodiment, a method of manufacturing a semiconductor package includes: (a) providing a substrate having an upper surface and a lower surface, (b) providing a first device having a first surface and a second surface, (c) providing a second device having a third surface and a fourth surface, (d) coupling, simultaneously, the first device and the second device to the substrate to produce a semiconductor package such that the first surface of the first device faces the upper surface of the substrate and the third surface of the second device faces the lower surface of the substrate, and (e) applying heat and force, concurrently, to the second surface of the first device and the fourth surface of the second device to secure the first device and the second device to the substrate.

In one embodiment, the providing step (b) includes the first surface of the first device having a first set of bumps formed thereon and the providing step (c) includes the third surface of the second device having a second set of bumps formed thereon, such that the first set of bumps makes physical contact with the upper surface of the substrate and the second set of bumps makes physical contact with the lower surface of the substrate during the coupling step (d).

In another embodiment, the providing step (b) includes forming a first non-conductive material adjacent the first set of bumps such that the first non-conductive material makes physical contact with the upper surface of the substrate during the coupling step (d).

In yet another embodiment, the providing step (c) includes forming a second non-conductive material adjacent the second set of bumps such that the second non-conductive material makes physical contact with the lower surface of the substrate during the coupling step (d).

In some embodiments, before the coupling step (d), a first non-conductive material can be applied to the upper surface of the substrate such that the first non-conductive material makes physical contact with the first set of bumps and the first surface of the first device during the coupling step (d). In the alternative, a second non-conductive material can be applied to the lower surface of the substrate before the coupling step (d) such that the second non-conductive material makes physical contact with the second set of bumps and the third surface of the second device during the coupling step (d).

In one embodiment, the method further includes: (f) forming a plurality of external interconnects on the lower surface of the substrate for routing electrical signals from at least one of the first device and the second device, and (g) forming an encapsulant that substantially covers the first device and the upper surface of the substrate. In another embodiment, the method further includes: (h) mounting a third device over the second surface of the first device, where the third device is in communication with at least one of the first device and the second device.

In one embodiment, a method of manufacturing a semiconductor package includes: (a) providing a substrate having an upper surface and a lower surface, (b) providing a first device having a first surface and a second surface, where the first surface has a first set of bumps formed thereon, (c) providing a second device having a third surface and a fourth surface, where the third surface has a second set of bumps formed thereon, (d) coupling, simultaneously, the first set of bumps to the upper surface of the substrate and the second set of bumps to the lower surface of the substrate to produce a semiconductor package, and (e) applying heat and force, simultaneously, to the second surface of the first device and the fourth surface of the second device to secure the first device and the second device to the substrate.

In one embodiment, the providing step (b) includes forming a first non-conductive material adjacent the first set of bumps such that the first non-conductive material is embedded between the first surface of the first device and the upper surface of the substrate during the coupling step (d).

In another embodiment, the providing step (c) includes forming a second non-conductive material adjacent the second set of bumps such that the second non-conductive material is embedded between the third surface of the second device and the lower surface of the substrate during the coupling step (d).

In one embodiment, before the coupling step (d), a first non-conductive material can be applied to the upper surface of the substrate such that the first non-conductive material is embedded among the first set of bumps and the first surface of the first device and the upper surface of the substrate during the coupling step (d).

In another embodiment, also before the coupling step (d), a second non-conductive material can be applied to the lower surface of the substrate such that the second non-conductive material is embedded among the second set of bumps and the third surface of the second device and the lower surface of the substrate during the coupling step (d).

In one embodiment, the method of manufacturing a semiconductor package further includes: (f) forming a plurality of external interconnects on the lower surface of the substrate for routing electrical signals from at least one of the first device and the second device, and (g) forming an encapsulant that substantially covers the first device and the upper surface of the substrate.

In another embodiment, the method further includes: (h) mounting a third device over the second surface of the first device, where the third device is in communication with at least one of the first device and the second device.

Other variations, embodiments and features of the present disclosure will become evident from the following detailed description, drawings and claims.

DETAILED DESCRIPTION OF THE DISCLOSURE

The present disclosure is described in one or more embodiments in the following description with reference to the figures, in which like numerals represent the same or similar elements. While the disclosure is described in terms of the best mode for achieving the disclosure's objectives, it will be appreciated by those skilled in the art that it is intended to cover alternatives, modifications, and equivalents as may be included within the spirit and scope of the disclosure as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1:
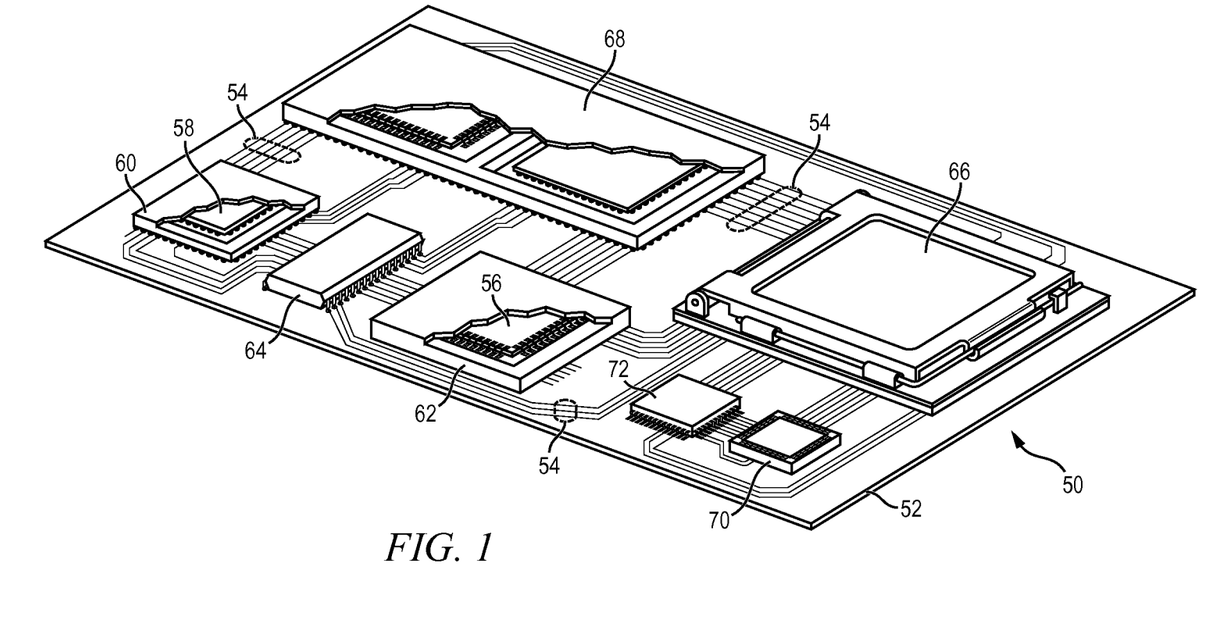
FIG. 1 illustrates a printed circuit board (PCB) with different types of packages mounted to its surface.

FIG. 1 illustrates electronic device 50 having a chip carrier substrate or PCB 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
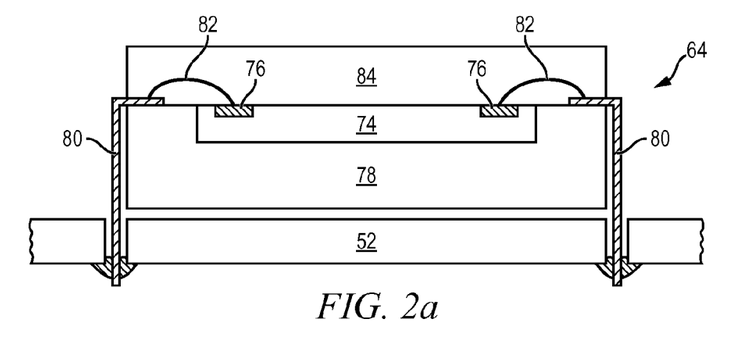
FIGS. 2a-2c illustrate further detail of the representative semiconductor packages mounted to the PCB.
Figure 2B:
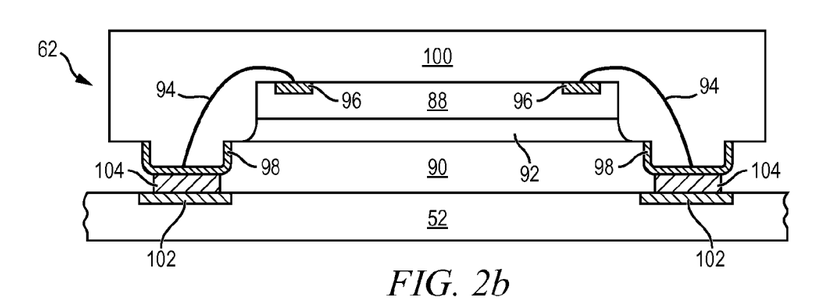
Figure 2C:
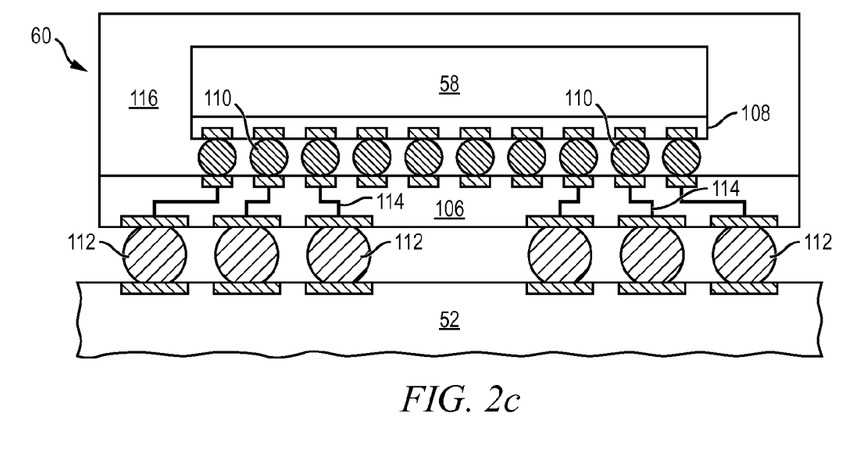

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), Cu, tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
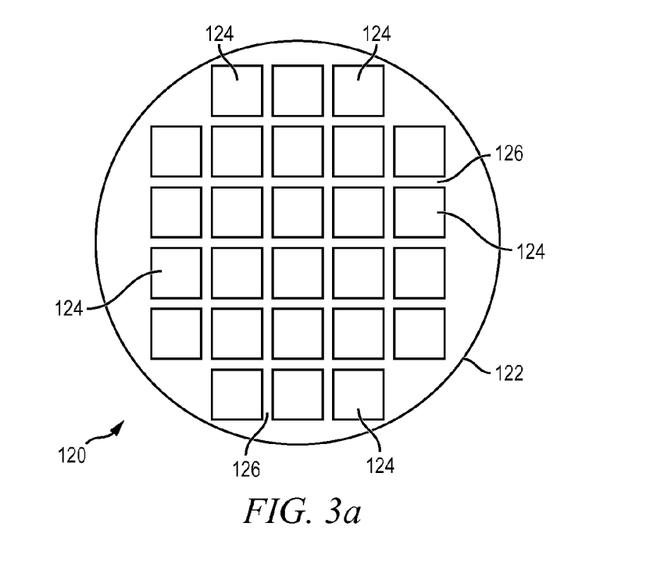
FIGS. 3a-3b illustrate a semiconductor wafer with a plurality of semiconductor die.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126, as described above. Saw street 126 provides cutting areas to singulate semiconductor wafer 120 into individual semiconductor die 124.

Figure 3B:
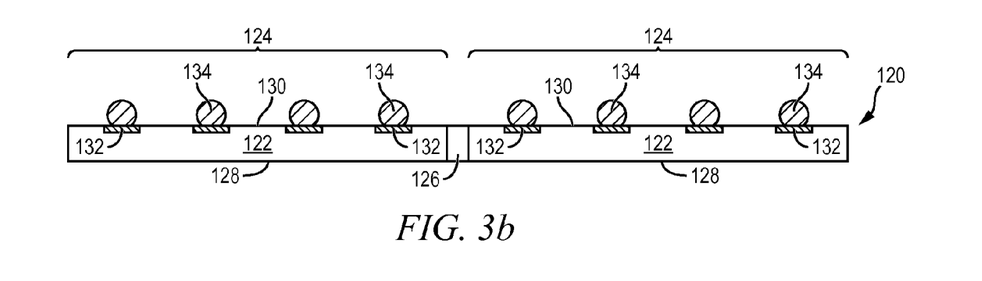

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), application specific integrated circuit (ASIC), memory, or other signal processing circuit. Semiconductor die 124 may also contain integrated passive devices (IPDs), such as inductors, capacitors, and resistors, for RF signal processing.

An active region 134 is formed on active surface 130 of semiconductor die 124, typically during the front-end manufacturing process. In one embodiment, active region 134 contains analog and digital circuits. In another embodiment, active region 134 includes one or more active sensors, such as photodiode, phototransistor, and Hall effect device, having the ability to generate or control the flow of electrical current in response to an external stimulus. Alternatively, active region 134 includes one or more passive sensors, such as a photoresistor, thermistor, capacitive accelerometer, and load cell, having the ability to alter the relationship between voltage and current in response to the external stimulus. Active region 134 can also contain a piezoelectric device, nanoelectronic device, or microelectromechanical device. The external stimulus can be light, sound, electromagnetic radiation, electric field, magnetic field, ionizing radiation, vibration, motion, acceleration, rotation, orientation, pressure, and temperature. Active region 134 is electrically connected to other analog and digital circuits on active surface 130 to perform design functions of semiconductor die 124 in response to the external stimulus.

An electrically conductive layer 132 is formed on active surface 130 using PVD, CVD, electrolytic plating, electroless plating process, or other suitable deposition process. Conductive layer 132 can be one or more layers of Al, Cu, Sn, Ni, Au, Ag, or other suitable electrically conductive material. Conductive layer 132 operates as contact pads electrically connected to active region 134, as well as the analog and digital circuits formed on active surface 130. Conductive layer 132 can be formed as contact pads disposed side-by-side a first distance from the edge of semiconductor die 124, as shown in FIG. 3b. Alternatively, conductive layer 132 can be formed as contact pads that are in multiple rows such that a first row of contact pads is disposed a first distance from the edge of the die, and a second row of contact pads alternating with the first row is disposed a second distance from the edge of the die.

Figure 4:
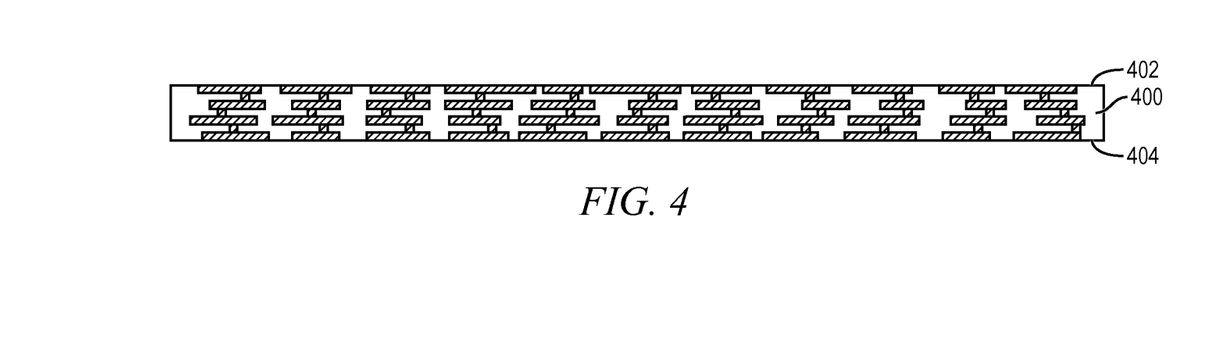
FIG. 4 is a cross-sectional view of a substrate to be used in the manufacturing of a semiconductor package according to one embodiment of the present disclosure.

Methods of manufacturing a semiconductor package using double-sided thermal compression bonding (TCB) are disclosed. In one embodiment, the semiconductor package can be a flip-chip package. FIG. 4 is a cross-sectional view of a substrate 400 to be used in the manufacturing of a flip chip semiconductor package according to one embodiment of the present disclosure. The substrate 400 can be a chip carrier substrate, a printed circuit board (PCB), a substrate strip, or other suitable material described above. In some embodiments, the substrate 400 can be a silicon interposer, silicon laminate or laminate interposer material. In other embodiments, the substrate 400 can be any suitable material capable of providing structural support and electrical interconnects of the semiconductor devices to be mounted thereon. As shown in the figure, the substrate 400 includes an upper surface 402 and a lower surface 404. Each of the surfaces 402, 404 can be used for receiving a semiconductor device. This will become more apparent in subsequent figures and discussion.

Figure 5:
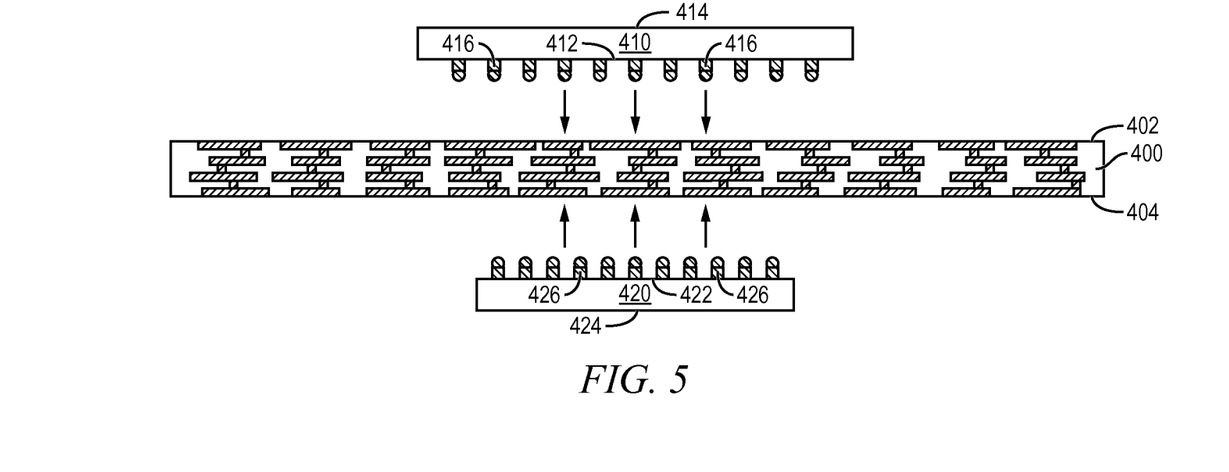
FIG. 5 is a cross-sectional view of FIG. 4 with the two devices to be coupled to the substrate.

FIG. 5 is a cross-sectional view of FIG. 4 with the substrate 400 flanked or surrounded on both sides by a first semiconductor device 410 and a second semiconductor device 420. Although described as semiconductor devices 410, 420, it will be appreciated by one skilled in the art that the semiconductor devices 410, 420 may be semiconductor dies 410, 420 including wafer level devices and all the other semiconductor components as discussed above.

As shown, the first device 410 includes a first surface 412 and a second surface 414 opposite the first surface 412. Similarly, the second device 420 includes a third surface 422 and a fourth surface 424 opposite the third surface 422. The semiconductor device 410, 420 can include microprocessors, memories, application specific integrated circuits (ASICs), logic circuits, analog circuits, RF circuits, discrete devices or other semiconductor devices or electrical components. In one embodiment, the first device 410 is a memory chip while the second device 420 is an application processor. In another embodiment, the first device 410 is larger than the second device 420. In other words, the first device 410 has at least one, two or all three dimensions (e.g., x, y, z-dimensions) being greater than the second device 420. In some embodiments, the two devices 410, 420 may be the same or similar devices.

In one embodiment, the first surface 412 of the first device 410 and the third surface 422 of the second device 420 can be the active sides. In other words, the sides where the active regions and the electrical conductivities can take place as described above. In the alternative, the second surface 414 of the first device 410 and the fourth surface 424 of the second device 420 can be the active sides. In other embodiments, as can be appreciated by one skilled in the art, one side or both sides of the semiconductor devices 410, 420 can have active regions or active devices.

In one embodiment, a first set of bumps 416 can be formed on the first surface 412 of the first device 410. In another embodiment, a second set of bumps 426 can be formed on the third surface 422 of the second device 420. In operation, as the first device 410 and the second device 420 are concurrently coupled to the substrate 400, the first set of bumps 416 would make physical contact with the upper surface 402 of the substrate 400 while the second set of bumps 426 would make physical contact with the lower surface 404 of the substrate 400. This will become more evident in subsequent figures and discussion.

In one embodiment, the bumps 416, 426 may be solder bumps associated with each respective semiconductor device 410, 420. In some embodiments, the bumps 416, 426 may be copper or gold balls or bumps. In other embodiments, the bumps 416, 426 may be other suitable electrical contact material as described above for routing electrical signals from each respective semiconductor device 410, 420. The bumps 416, 426 can be formed by known semiconductor processes as can be appreciated by one skilled in the art or as described above and will not be discussed in detail herein.

Figure 6A:
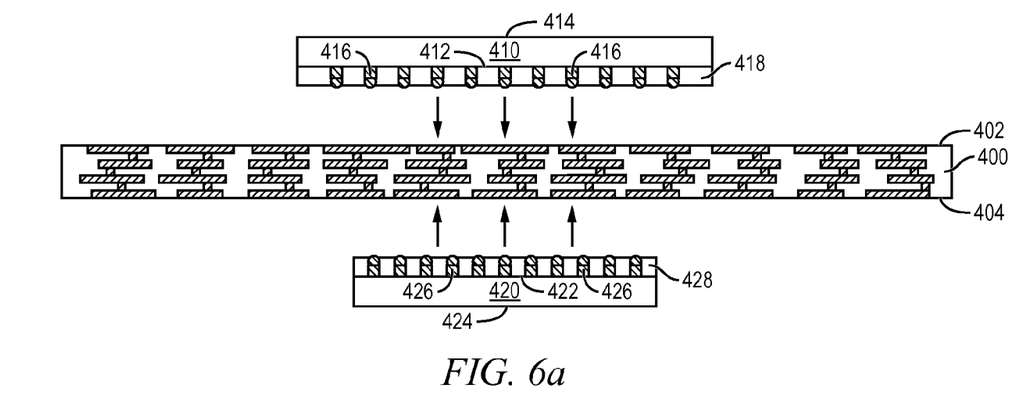
FIG. 6a is a cross-sectional view of FIG. 5 with the non-conductive materials applied to the two devices.

FIG. 6a is a cross-sectional view of FIG. 5 with non-conductive materials 418, 428 being applied to the two devices 410, 420 prior to the device 410, 420 being coupled to the substrate 400 at the same time according to one embodiment of the present disclosure. In one embodiment, the non-conductive material 418, 428 can be non-conductive paste. In another embodiment, the non-conductive material 418, 428 can be non-conductive film.

The non-conductive materials 418, 428 help to facilitate the bonding In one embodiment, a first non-conductive film 418 can be applied adjacent the first set of bumps 416. In another embodiment, a second non-conductive film 428 can be applied adjacent the second set of bumps 426. The non-conductive films 418, 428 can be applied by coating, laminating or other suitable deposition techniques as can be appreciated by one skilled in the art. In some embodiments, instead of non-conductive films 418, 428, non-conductive pastes may be utilized instead to perform similar functions. The non-conductive materials 418, 428 are able to provide conformal coverage by filling any spaces or gaps between the bumps 416, 426. In other words, the non-conductive pastes or films 418, 428 may function like an underfill material.

In operation, as the first device 410 and the second device 420 are concurrently brought together "sandwiching" the substrate 400, the first non-conductive film 418 would make physical contact with the upper surface 402 of the substrate 400 while the second non-conductive film 428 would make physical contact with the lower surface 404 of the substrate 400. This will become more evident in subsequent figures and discussion.

Figure 6B:
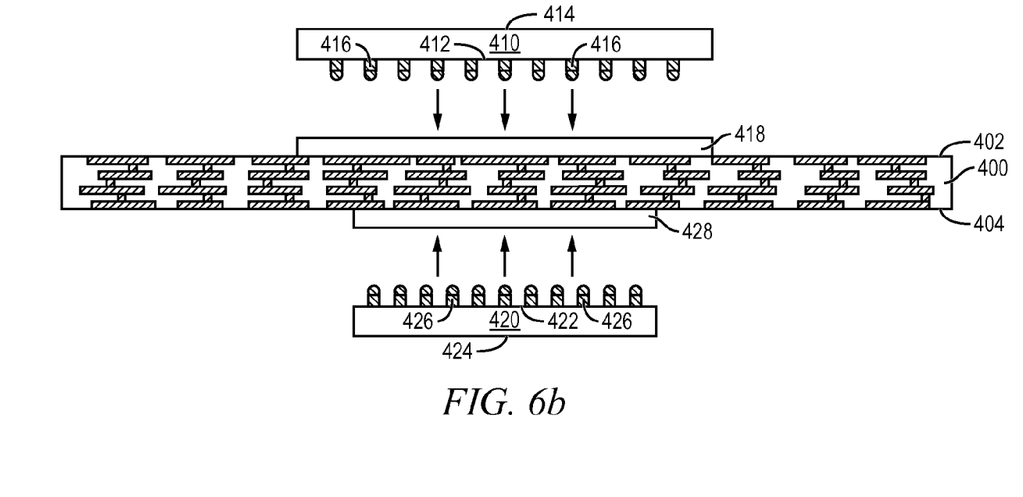
FIG. 6b is a cross-sectional view of FIG. 5 with the non-conductive materials applied to the substrate.

In an alternative embodiment, instead of applying the non-conductive films 418, 428 to the devices 410, 420, the non-conductive films 418, 428 may be applied to the substrate 400 instead prior to the coupling of the devices 410, 420 to the substrate 400.

FIG. 6b is a cross-sectional view of FIG. 5 where the non-conductive films 418, 428 are initially applied to the substrate 400 prior to the joining of the device 410, 420. As shown in the figure, in one embodiment, a first non-conductive film 418 can be applied to the upper surface 402 of the substrate 400. In another embodiment, a second non-conductive film 428 can be applied to the lower surface 404 of the substrate 400. In operation, as the first device 410 and the second device 420 are jointly bonded to the substrate 400, the first non-conductive film 418 would make physical contact with the first set of bumps 416 and the first surface 412 of the first device 410 while the second non-conductive film 428 would make physical contact with the second set of bumps 426 and the third surface 422 of the second device 420.

Figure 7:
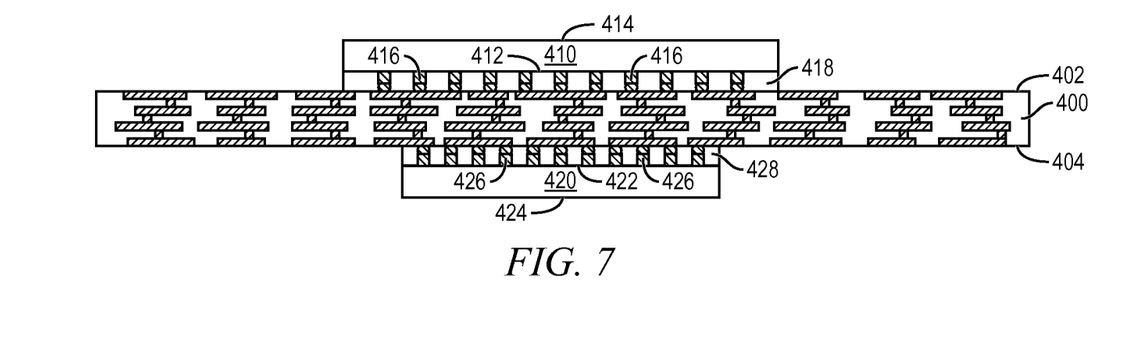
FIG. 7 is a cross-sectional view of the simultaneous coupling of the two devices to the substrate from that of FIG. 6a or FIG. 6b.

FIG. 7 is a cross-sectional view of the simultaneous coupling of the two semiconductor devices 410, 420 to the substrate 400 from that of FIG. 6a or FIG. 6b. In one embodiment, the simultaneous coupling of the first device 410 and the second device 420 to the substrate 400 would produce a semiconductor package whereby the first surface 412 of the first device 410 faces the upper surface 402 of the substrate 400 while the third surface 422 of the second device 420 faces the lower surface 404 of the substrate 400.

In some embodiments, prior to the simultaneous coupling of the two devices 410, 420 to the substrate 400, a pre-bake or heating cycle can be carried out on the substrate 400 to facilitate the coupling process.

Figure 8:
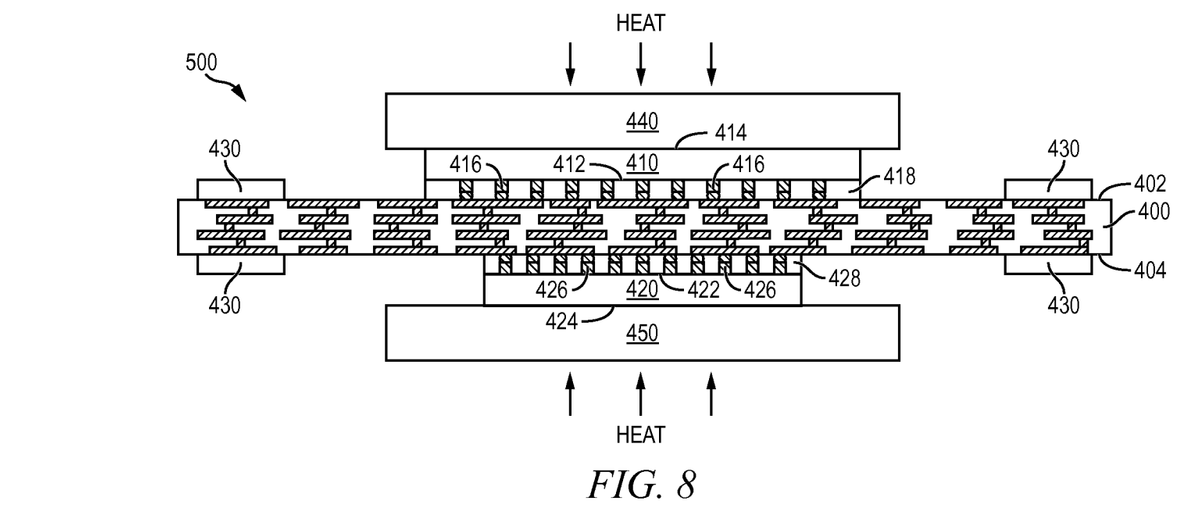
FIG. 8 is a cross-sectional view of FIG. 7 with the application of heat or pressure or both.

FIG. 8 is a cross-sectional view of FIG. 7 with the application of heat or pressure or both to the semiconductor package 500 using a thermal compression bonding (TCB) process. In one embodiment, to further effectuate the bonding process as shown in FIG. 7, heat and pressure can be jointly applied to the second surface 414 of the first device 410 and the fourth surface 424 of the second device 420 to further secure each of the first device 410 and the second device 420 to the substrate 400. The application of heat and pressure can be carried out by metal plates 440, 450 or other suitable elements 440, 450 as shown in the figure.

In another embodiment, instead of heat and pressure, heat or pressure alone can be concomitantly applied to the second surface 414 and the fourth surface 424 similar to that discussed above, the application of heat or pressure able to further secure each of the first device 410 and the second device 420 to the substrate 400 by driving metallurgical or other bonding between the bumps 416, 426, the non-conductive materials 418, 428 and the substrate 400. The application of heat or pressure can be carried out using similar metal plates 440, 450 or other suitable elements 440, 450 as can be appreciated by one skilled in the art.

The amount of force to be applied can be approximately half in comparison to the amount of force required for TCB of a single device. In other words, the amount of force for the currently disclosed embodiments may be about half of the bond force for TCB a single semiconductor die, whether the bonding be carried out with only the first device 410 or the second device 420, to a substrate 400. In other words, the amount of force required may be halved from that of a standard single-sided TCB because the forces are being exerted or shared from both sides of the substrate 400.

In yet another embodiment, TCB process utilizes the application of both heat and pressure, simultaneously, to both the second surface 414 of the first device 410 and the fourth surface 424 of the second device 420, the application of the heat and pressure able to further facilitate the bonding of each of the first device 410 and the second device 420 to the substrate 400. In these instances, the TCB process of using whether heat or pressure or both, can be carried out with the assistance of clamps 430 about the edges of the substrate 400. It will be appreciated by one skilled in the art that via the TCB process, the combination of heat and pressure is able to facilitate and enhance the bonding process among the bumps 416, 426, the non-conductive films 418, 428 and the surfaces 412, 422, 402, 404, the bonding enhancements being understood by one skilled in the art and will not be elaborated further herein.

Figure 9:
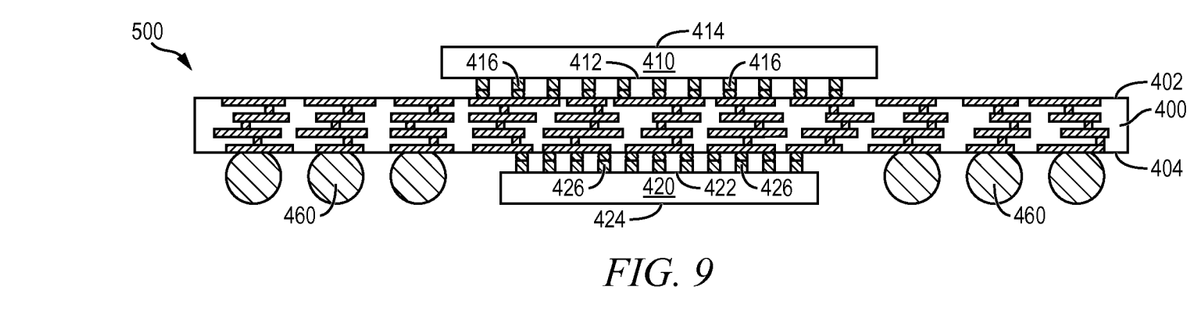
FIG. 9 is a cross-sectional view of FIG. 8 with the addition of external interconnects.

FIG. 9 is a cross-sectional view of FIG. 8 with the addition of external interconnects 460 according to one embodiment of the present disclosure. In this embodiment, a plurality of external interconnects 460 such as solder bumps or solder balls may be formed on the lower surface 404 of the substrate 400 for routing electrical signals from the first device 410 or the second device 420 or both devices 410, 420. In some embodiments, the external interconnects 460 can be other suitable metal contacts including without limitation copper pillars or redistribution layers (RDLs). In other embodiments, the external interconnects 460 can be formed using similar materials and/or techniques as described above.

Figure 10:
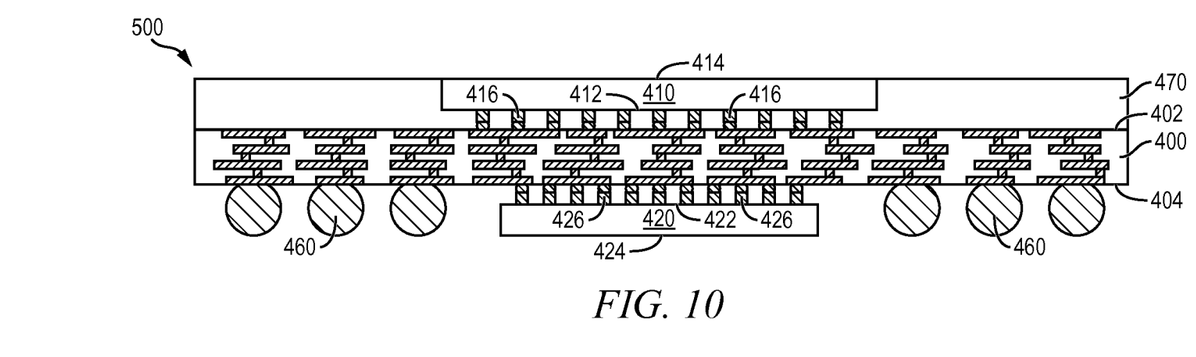
FIG. 10 is a cross-sectional view of FIG. 9 with the addition of an encapsulation.

FIG. 10 is a cross-sectional view of FIG. 9 with the addition of an encapsulation 470 according to one embodiment of the present disclosure. In this embodiment, the encapsulation 470 can be an encapsulant material such as a molding compound that substantially covers the first device 410 and the upper surface 402 of the substrate 400. The encapsulant 470 can help to protect the package 500 from external factors in the environment including without limitation heat, moisture, humidity, physical damage or parasitic RF signals, among others.

Figure 11:
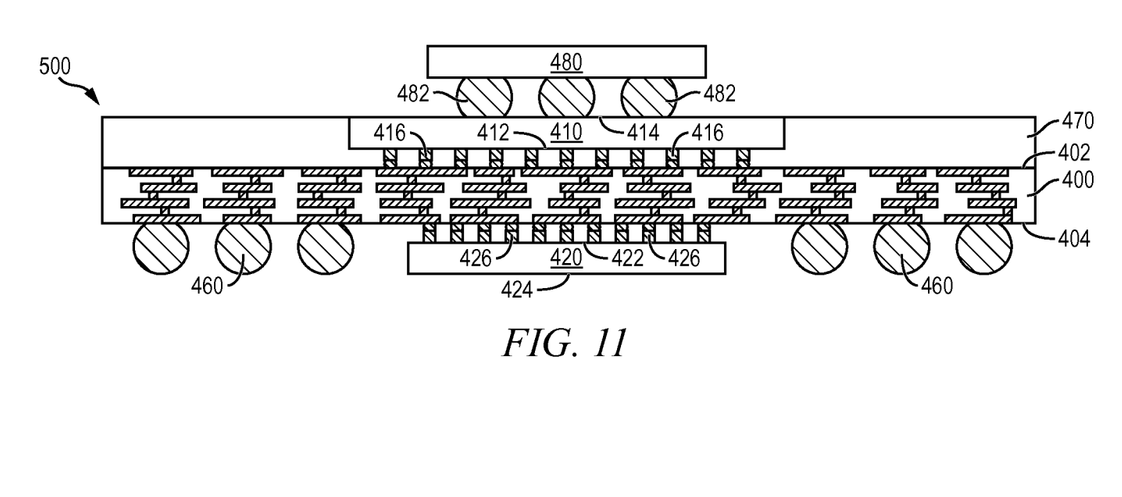
FIG. 11 is a cross-sectional view of FIG. 10 with the addition of a third device to the semiconductor package according to another embodiment of the present disclosure.

FIG. 11 is a cross-sectional view of FIG. 10 with the addition of a third device 480 mounted to the flip chip semiconductor package 500 according to one embodiment of the present disclosure. In this embodiment, the third device 480 can be mounted over the second surface 414 of the first device 410, the third device 480 being a semiconductor device similar to that of the first device 410 or the second device 420. The third device 480 can be in communication with the first device 410 via a series of solder bumps or balls 482 or other interconnect contact material similar to those described herein. In some embodiments, the third device 480 can be in communication with the first device 410 or the second device 420 or both devices 410, 420. In other embodiments, in addition to solder bumps 482, the first device 410 may include through silicon vias (TSVs) and/or bond wires (not shown) to facilitate communication with the third device 480 and/or to facilitate the communication between the third device 480 and the second device 420. Signals from the third device 480 may also be transmitted through the external interconnects 460.

In one embodiment, a method of manufacturing a flip chip semiconductor package 500 using double-sided thermal compression bonding (TCB) includes a first step of providing a substrate 400 having an upper surface 402 and a lower surface 404. Next, a first device 410 can be provided, the first device 410 having a first surface 412 and a second surface 414. Concomitantly, a second device 420 can be provided, the second device 420 having a third surface 422 and a fourth surface 424. The two devices 410, 420 may subsequently be coupled, simultaneously, to the substrate 400 to produce a flip-chip semiconductor package. In doing so, the first surface 412 of the first device 410 would be facing the upper surface 402 of the substrate 400 while the third surface 422 of the second device 420 would be facing the lower surface 404 of the substrate. Next, heat and force can be applied simultaneously to facilitate the thermal compression bonding of the two devices 410, 420 to the substrate 400. The heat and pressure can be applied, concurrently, to the second surface 414 of the first device 410 and the fourth surface 424 of the second device 420 such that each of the first device 410 and the second device 420 can be secured to the substrate 400 to produce the semiconductor package 500 according to one embodiment of the present disclosure.

In one embodiment, a first set of bumps 416 can be formed on the first surface 412 of the first device 410 such that the first set of bumps 416 makes physical contact with the upper surface 402 of the substrate 400 during the coupling step described above. In another embodiment, a second set of bumps 426 can be formed on the third surface 422 of the second device 420 such that the second set of bumps 426 makes physical contact with the lower surface 404 of the substrate 400 during the same coupling step. These embodiments can occur simultaneously or separately. However, the coupling step will occur at the same time.

In another embodiment, a first non-conductive film 418 can be disposed adjacent the first set of bumps 416 such that the first non-conductive film 418 and the first set of bumps 416 make physical contact with the upper surface 402 of the substrate 400 during the coupling step described above. In yet another embodiment, a second non-conductive film 428 can be disposed adjacent the second set of bumps 426 such that the second non-conductive film 428 and the second set of bumps 426 make physical contact with the lower surface 404 of the substrate 400 during the same coupling step. These embodiments can occur simultaneously or separately. However, the coupling step will occur at the same time.

In yet another embodiment, instead of applying the non-conductive films 418, 428 to the devices 410, 420, the non-conductive films 418, 428 may be applied to the substrate 400 instead. In other words, in one embodiment, a first non-conductive film 418 can be applied to the upper surface 402 of the substrate 400. In another embodiment, a second non-conductive film 428 can be applied to the lower surface 404 of the substrate 400. In operation, during the simultaneous coupling of the first device 410 and the second device 420 to the substrate 400, the first non-conductive film 418 will be able to make physical contact with the first set of bumps 416 and the first surface 412 of the first device 410 while the second non-conductive film 428 will be able to make physical contact with the second set of bumps 426 and the third surface 422 of the second device 420.

In one embodiment, a method of manufacturing a flip chip semiconductor package 500 further includes forming a plurality of external interconnects 460 on the lower surface 404 of the substrate 400 for routing electrical signals from at least one of the first device 410 and the second device 420, as well as forming an encapsulant 470 that substantially covers the first device 410 and the upper surface 402 of the substrate 400. Like above, the encapsulant provides ruggedness to the package 500 as well as helps to protect the package 500 from external factors including without limitation physical damage, heat, stress, among others.

In another embodiment, a method of manufacturing a flip chip semiconductor package 500 further includes mounting a third device 480 over the second surface 414 of the first device 410. In yet another embodiment, the third device 480 can be in communication with the first device 410 or the second device 420 or both devices 410, 420. Electrical signals from the third device 480 can be routed through the external interconnects 460.

In one embodiment, a method of manufacturing a flip chip semiconductor package 500 using double-sided thermal compression bonding (TCB) includes a first step of providing a substrate 400 having an upper surface 402 and a lower surface 404. Next, a first device 410 can be provided, the first device 410 having a first surface 412 and a second surface 414, the first surface 412 having a plurality of bumps 416 formed thereon. Concomitantly, a second device 420 can be provided, the second device 420 having a third surface 422 and a fourth surface 424, the third surface 422 having a second set of bumps 426 formed thereon. The two devices 410, 420 may subsequently be coupled, simultaneously, to the substrate 400. In doing so, the first set of bumps 416 of the first device 410 would come into physical contact with the upper surface 402 of the substrate 400 while the second set of bumps 426 of the second device 420 would come into physical contact with the lower surface 404 of the substrate.

Next, heat and force can be applied simultaneously to facilitate the thermal compression bonding of the two devices 410, 420 to the substrate 400. The heat and pressure can be applied, concurrently, to the second surface 414 of the first device 410 and the fourth surface 424 of the second device 420 such that each of the first device 410 and the second device 420 can be secured to the substrate 400 to produce the semiconductor package 500 according to one embodiment of the present disclosure.

In one embodiment, prior to the coupling step described above, a first non-conductive film 418 can be applied to the upper surface 402 of the substrate 400 or adjacent the first set of bumps 416 on the first surface 412 of the first device 410 such that the first non-conductive film 416 is embedded between the first surface 412 of the first device 410 and the upper surface 402 of the substrate 400 during the simultaneous coupling step. In another embodiment, a second non-conductive film 428 can be applied to the lower surface 404 of the substrate 400 or adjacent the second set of bumps 426 on the third surface 422 of the second device 420 such that the second non-conductive film 428 is embedded between the third surface 422 of the second device 420 and the lower surface 404 of the substrate 400 during the same simultaneous coupling step.

In some embodiments, the currently disclosed methods of manufacturing flip chip semiconductor packages using double-sided thermal compression bonding (TCB) can achieve cost savings including the elimination of through-silicon vias (TSVs). In addition, the currently disclosed packaging method is able to produce devices with shorter routing signals because of the direct electrical paths from each of the first device and the second device to the substrate, in contrast to a semiconductor package having to employ TSVs and multiple TCB processing steps. The simultaneous coupling of two devices to a substrate may also further facilitate faster throughput by allowing parallel packaging of devices to take place in contrast to packaging devices in series.

In other embodiments, the currently disclosed methods are able to produce thinner flip chip semiconductor packages (less than about 0.5 mm) and without the use of three-dimensional TSVs. Furthermore, faster package assembly throughout can be carried out by double-sided TCB process and post TCB cure at the same time resulting in a two-fold throughput efficiency and improvement.

Although the current description has been described in detail with reference to several embodiments, additional variations and modifications exist within the scope and spirit of the disclosure.

What is claimed is:

1. A method of making a semiconductor device, comprising:
   providing a substrate including an upper surface and a lower surface opposite the upper surface;
   providing a first semiconductor component including a first surface and a second surface opposite the first surface;
   forming a plurality of first bumps over the first surface of the first semiconductor component;

forming a first non-conductive material over the first surface of the first semiconductor component around the plurality of first bumps;
providing a second semiconductor component including a third surface and a fourth surface opposite the third surface;
forming a plurality of second bumps over the third surface of the second semiconductor component;
forming a second non-conductive material over the third surface of the second semiconductor component around the plurality of second bumps;
heating the substrate;
simultaneously mounting the first and second semiconductor components to the substrate after heating the substrate with the plurality of first bumps and first non-conductive material contacting the upper surface of the substrate and the plurality of second bumps and second non-conductive material contacting the lower surface of the substrate; and
forming a plurality of interconnect structures over the lower surface of the substrate outside a footprint of the second semiconductor component.

2. The method of claim 1, further including simultaneously applying force to the second surface of the first semiconductor component and the fourth surface of the second semiconductor component to secure the first semiconductor component and the second semiconductor component to the substrate.

3. The method of claim 1, further including forming an encapsulant covering a side surface of the first semiconductor component and the upper surface of the substrate.

4. The method of claim 1, further including mounting a third semiconductor component over the second surface of the first semiconductor component.

5. A method of making a semiconductor device, comprising:
providing a substrate including an upper surface and a lower surface opposite the upper surface;
providing a first semiconductor component including a first surface and a second surface opposite the first surface;
forming a first non-conductive material over the first surface of the first semiconductor component;
providing a second semiconductor component including a third surface and a fourth surface opposite the third surface;
forming a second non-conductive material over the third surface of the second semiconductor component;
simultaneously mounting the first semiconductor component including the first non-conductive material to the upper surface of the substrate and the second semiconductor component including the second non-conductive material to the lower surface of the substrate; and
concurrently applying heat and force to the second surface of the first semiconductor component and the fourth surface of the second semiconductor component to secure the first semiconductor component and the second semiconductor component to the substrate.

6. The method of claim 5, further including:
forming a plurality of first bumps over the first surface of the first semiconductor component; and
forming a plurality of second bumps over the third surface of the second semiconductor component, wherein the plurality of first bumps contact the upper surface of the substrate and the plurality of second bumps contact the lower surface of the substrate during the mounting step.

7. The method of claim 6, further including forming the first non-conductive material around the plurality of first bumps such that the first non-conductive material makes physical contact with the upper surface of the substrate during the mounting step.

8. The method of claim 6, further including forming the second non-conductive material around the plurality of second bumps such that the second non-conductive material makes physical contact with the lower surface of the substrate during the mounting step.

9. The method of claim 5, further including:
forming a plurality of external interconnects on the lower surface of the substrate for routing electrical signals from at least one of the first semiconductor component and the second semiconductor component; and
forming an encapsulant over a side surface of the first semiconductor component and the upper surface of the substrate.

10. The method of claim 9, further including mounting a third semiconductor component over the second surface of the first semiconductor component.

11. The method of claim 5, further including clamping the substrate in position during the simultaneously mounting step.

12. The method of claim 5, wherein the first semiconductor component is larger than the second semiconductor component.

13. A method of making a semiconductor device, comprising:
providing a substrate including an upper surface and a lower surface opposite the upper surface;
providing a first semiconductor die including a first surface and a second surface opposite the first surface;
forming a plurality of first bumps over the first surface of the first semiconductor die;
forming a first non-conductive material over the first surface of the first semiconductor die around the plurality of first bumps;
providing a second semiconductor die including a third surface and a fourth surface opposite the third surface;
forming a plurality of second bumps over the third surface of the second semiconductor die;
forming a second non-conductive material over the third surface of the second semiconductor die around the plurality of second bumps;
simultaneously mounting the first semiconductor die with the plurality of first bumps and first non-conductive material contacting the upper surface of the substrate and the second semiconductor die with the plurality of second bumps and second non-conductive material contacting the lower surface of the substrate; and
simultaneously applying heat and force to the second surface of the first semiconductor die and the fourth surface of the second semiconductor die.

14. The method of claim 13, further including forming the first non-conductive material around the plurality of first bumps such that the first non-conductive material is disposed between the first surface of the first semiconductor die and the upper surface of the substrate.

15. The method of claim 13, further including forming the second non-conductive material around the plurality of second bumps such that the second non-conductive material is disposed between the third surface of the second semiconductor die and the lower surface of the substrate.

16. The method of claim 13, further including:
forming a plurality of external interconnects on the lower surface of the substrate for routing electrical signals from at least one of the first semiconductor die and the second semiconductor die; and forming an encapsulant over a side surface of the first semiconductor die and the upper surface of the substrate.

17. The method of claim 16, further including disposing a third semiconductor die over the second surface of the first semiconductor die.

18. The method of claim 13, further including clamping the substrate in position during the simultaneously mounting step.

19. The method of claim 13, wherein the first semiconductor die includes a memory circuit and the second semiconductor die includes a processor.

20. A method of making a semiconductor device, comprising:

providing a substrate including a first surface and a second surface opposite the first surface;

providing a first semiconductor die including a third surface and a fourth surface opposite the third surface;

forming a first non-conductive layer over the third surface of the first semiconductor die;

providing a second semiconductor die including a fifth surface and a sixth surface opposite the fifth surface;

forming a second non-conductive layer over the fifth surface of the second semiconductor die; and simultaneously mounting the first semiconductor die with the first non-conductive layer contacting the first surface of the substrate and the second semiconductor die with the second non-conductive layer contacting the second surface of the substrate.

21. The method of claim 20, further including heating the substrate prior to mounting the first and second semiconductor dies over the substrate.

22. The method of claim 20, further including concurrently applying heat and force to the fourth surface of the first semiconductor die and to the sixth surface of the second semiconductor die to secure the first and second semiconductor dies to the substrate.

23. The method of claim 22, further including curing the first and second non-conductive layers after applying heat and force to the first and second semiconductor dies.

24. The method of claim 20, further including:

forming an interconnect structure over the second surface of the substrate; and disposing a third semiconductor die over the first semiconductor die and electrically connected to the interconnect structure.

25. The method of claim 20, further including clamping the substrate in position during the simultaneously mounting step.

26. The method of claim 20, wherein the first semiconductor die is larger than the second semiconductor die.

27. The method of claim 20, wherein the first semiconductor die includes a memory circuit and the second semiconductor die includes a processor.

* * * * *